United States Patent
Chang et al.

(10) Patent No.: US 10,366,889 B2
(45) Date of Patent: Jul. 30, 2019

(54) METHOD OF FORMING SEMICONDUCTOR DEVICE

(71) Applicants: UNITED MICROELECTRONICS CORP., Hsin-Chu (TW); Fujian Jinhua Integrated Circuit Co., Ltd., Quanzhou, Fujian province (CN)

(72) Inventors: Feng-Yi Chang, Tainan (TW); Fu-Che Lee, Taichung (TW); Chieh-Te Chen, Kaohsiung (TW); Yi-Ching Chang, Pingtung County (TW)

(73) Assignees: UNITED MICROELECTRONICS CORP., Hsin-Chu (TW); Fujian Jinhua Integrated Circuit Co., Ltd., Quanzhou, Fujian Province (CN)

( * ) Notice: Subject to any disclaimer, the term of this patent is extended or adjusted under 35 U.S.C. 154(b) by 0 days.

(21) Appl. No.: 15/660,967

(22) Filed: Jul. 27, 2017

(65) Prior Publication Data
US 2018/0374702 A1     Dec. 27, 2018

(30) Foreign Application Priority Data
Jun. 27, 2017   (CN) .......................... 2017 1 0499222

(51) Int. Cl.
*H01L 21/033*   (2006.01)
*H01L 21/3213*  (2006.01)
*H01L 27/115*   (2017.01)

(52) U.S. Cl.
CPC ...... *H01L 21/0337* (2013.01); *H01L 21/0332* (2013.01); *H01L 21/32139* (2013.01); *H01L 27/115* (2013.01)

(58) Field of Classification Search
CPC .......... H01L 21/0332; H01L 21/32139; H01L 21/0337; H01L 27/115; G03F 7/0035
See application file for complete search history.

(56) References Cited

U.S. PATENT DOCUMENTS

| | | | |
|---|---|---|---|
| 7,572,572 B2 | 8/2009 | Wells | |
| 9,012,326 B2 | 4/2015 | Kim et al. | |
| 9,054,051 B2 | 6/2015 | Jeong et al. | |
| 9,431,324 B2 | 8/2016 | Shin | |
| 2005/0175937 A1* | 8/2005 | Bae | H01L 21/266 430/312 |
| 2010/0028801 A1 | 2/2010 | Holmes et al. | |
| 2013/0157461 A1* | 6/2013 | Kim | H01L 21/0337 438/671 |
| 2015/0153649 A1 | 6/2015 | Lee et al. | |

* cited by examiner

*Primary Examiner* — Jasmine J Clark
(74) *Attorney, Agent, or Firm* — Winston Hsu

(57) ABSTRACT

A method of forming a semiconductor device includes the following steps. First of all, a material layer is formed on a substrate, and a sidewall image transferring process is performed to form plural first mask patterns on the material layer, with the first mask patterns parallel extended along a first direction. Next, a pattern splitting process is performed to remove a portion of the first mask patterns to form plural second openings, with the second openings parallel extended along a second direction, across the first mask patterns. Then, the material layer is patterned by using rest portions of the first mask patterns as a mask to form plural patterns arranged in an array.

16 Claims, 7 Drawing Sheets

METHOD OF FORMING SEMICONDUCTOR DEVICE

BACKGROUND OF THE INVENTION

1. Field of the Invention

The present invention relates to a method of forming a semiconductor device, and more particularly to a method of forming a semiconductor device through a multiple patterning process.

2. Description of the Prior Art

Fabrication of microstructures requires tiny elements of precisely controlled size formed in a material layer of an appropriate substrate such as semiconductor substrate/layers, dielectric layers and/or metal layers. These tiny elements are generated by patterning the abovementioned substrate/layers, for instance, by performing photolithography and etching processes. For this purposes, in conventional semiconductor techniques, a mask layer is formed on the target, and these tiny elements are defined in the mask layer and followed by being transferred to the target layer. Generally, the mask layer may include or is formed by means of a layer of photoresist that is patterned by lithographic process and/or patterned hard mask including the patterns transferred from the patterned photoresist.

As feature sizes are decreased by the complexity of currently integrated circuits, the existing single patterning process has met its bottleneck to successfully render the features. That is, the overlay accuracy and the resolution among this feature have to push the lithographic limit further to create even smaller, more densely packed devices. Therefore, it is still urgent to those of skilled in the art to develop or improve the conventional scheme for these tiny elements.

SUMMARY OF THE INVENTION

It is one of the primary objectives of the present invention to provide a method of forming a semiconductor device, in which a multiple patterning process such as a sidewall image transfer (SIT) technique and a pattern splitting process is utilized to form mask patterns and opening which are across with each other. In this way, a smaller, more densely packed device is formed under a simplified process flow using a reduced number of photo masks.

To achieve the purpose described above, the present invention provides a method of forming a semiconductor device including the following steps. First of all, a material layer is provided on a substrate. Next, a spacer patterning process is performed to form a plurality of first mask patterns on the material layer, with the first mask patterns parallel extending along a first direction. Then, a pattern splitting process is performed to remove a portion of the first mask patterns, thereto form a plurality of second openings, with the second openings parallel extending along a second direction across the first mask patterns. Finally, the material layer is patterned by using rest portions of the first mask patterns as a mask, to form a plurality of patterns in an array arrangement.

Overall, the method of the present invention utilizes a multiple patterning process, such as the SIT process and the pattern splitting process, to form the mask patterns and the openings respectively in a material layer, such as the hard mask layer and/or the target layer. The mask patterns and the openings are parallel extended along different directions, with those mask patterns and the openings either across with each other or perpendicular to each other. That is, the original mask patterns may be partially removed while the openings are formed, so that, the rest portion of the mask patterns may form a plurality of patterns in the same and regular shape like a parallelogram-shape, a rectangular-shape or a square-shape. Also, the patterns are in an array arrangement from a top view. In this way, the patterns may further be used on patterning the aforementioned material layers, thereto form tiny hard mask patterns and/or target patterns in a more densely layout. Thus, the method of the present invention is allowable to form required tiny elements of a semiconductor device under a simplified process flow using a reduced number of photo masks.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 8 are schematic diagrams illustrating a method of forming a semiconductor device according to a first embodiment of the present invention, in which:

FIG. 1 shows a top view of a semiconductor device after forming first mask patterns;

FIG. 2 shows a cross-sectional view of a semiconductor device after forming first mask patterns;

FIG. 3 shows a top view of a semiconductor device after forming first primary openings;

FIG. 4 shows a cross-sectional view of a semiconductor device after forming first primary openings;

FIG. 5 shows a top view of a semiconductor device after forming second primary openings;

FIG. 6 shows a cross-sectional view of a semiconductor device after forming second primary openings;

FIG. 7 shows a top view of a semiconductor device after forming patterns; and

FIG. 8 shows a cross-sectional view of a semiconductor device after forming patterns.

FIG. 11 to FIG. 13 are schematic diagrams illustrating a method of forming a semiconductor device according to a first embodiment of the present invention, in which:

FIG. 11 shows a top view of a semiconductor device after forming first primary openings;

FIG. 12 shows a cross-sectional view of a semiconductor device after forming first primary openings; and FIG. 13 shows a top view of a semiconductor device after forming patterns.

DETAILED DESCRIPTION

To provide a better understanding of the presented invention, preferred embodiments will be described in detail. The preferred embodiments of the present invention are illustrated in the accompanying drawings with numbered elements.

Please refer to FIG. 1 to FIG. 8, which are schematic diagrams illustrating a forming process of a semiconductor device according to the first embodiment of the present invention, wherein FIGS. 1, 3, 5 and 7 respectively show a top view of the semiconductor device during the forming process, and other figures respectively show a cross-sectional view along cross lines A-A', B-B' and C-C' in FIGS. 1, 3, 5 and 7.

Figure 2:
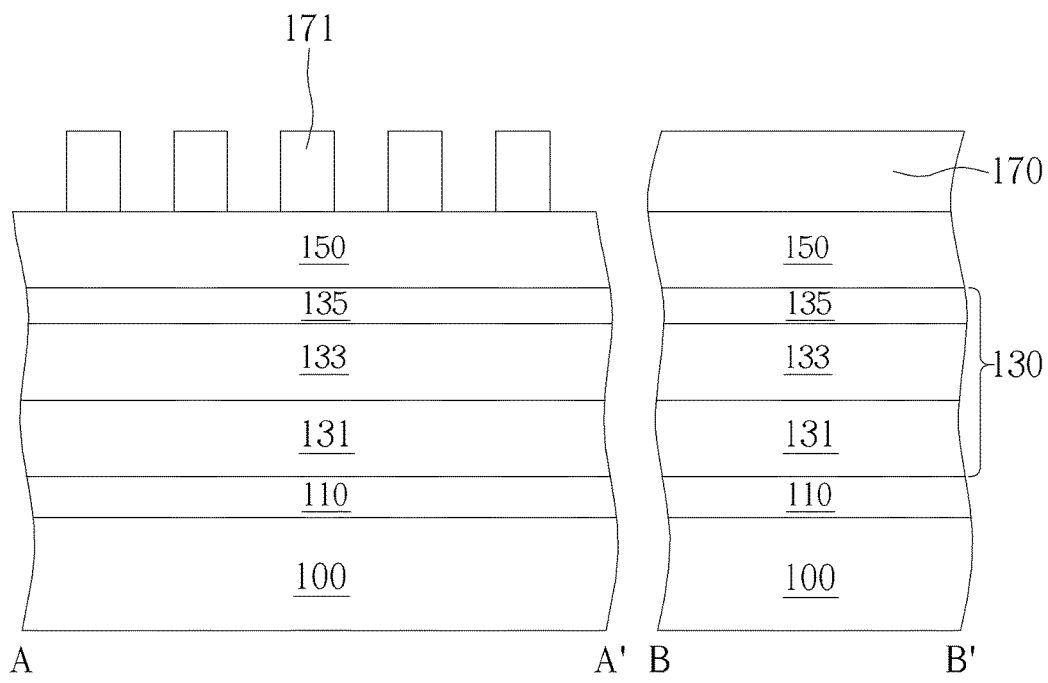

First of all, a substrate layer 100 is provided, and the substrate layer 100 for example includes a semiconductor substrate (not shown in the drawings) like a silicon substrate, a silicon containing substrate or a silicon-on-insulator (SOI) substrate, and/or a dielectric layer (not shown in the drawings), such as including silicon oxide ($SiO_x$), silicon nitride (SiN) or silicon oxynitride (SiON), stacked on the semiconductor substrate, but is not limited thereto. The substrate layer 100 has a first region 100a and a second region 100b, and a target layer 110, a hard mask layer 130 and a mask layer 150 are sequentially formed on the substrate layer 100, covering both the first region 100a and the second region 100b, as shown in FIG. 2.

In the present embodiment, the hard mask layer 130 for example includes a multilayer structure having a first hard mask layer 131 including a material like SiN, a second hard mask layer 133 including a material like APF member from Applied Materials, Inc., and a third hard mask layer 135 including a material like SiON, but is not limited thereto. In another embodiment, the hard mask layer may also include a monolayer structure having a single layer of hard mask layer (not shown in the drawings), such as including SiN, SiON, APF member or SiC. Then, the mask layer 150 disposed on the hard mask layer 130 preferably includes a material having an etching selectivity related to the hard mask layer 130, like polysilicon.

Figure 1:
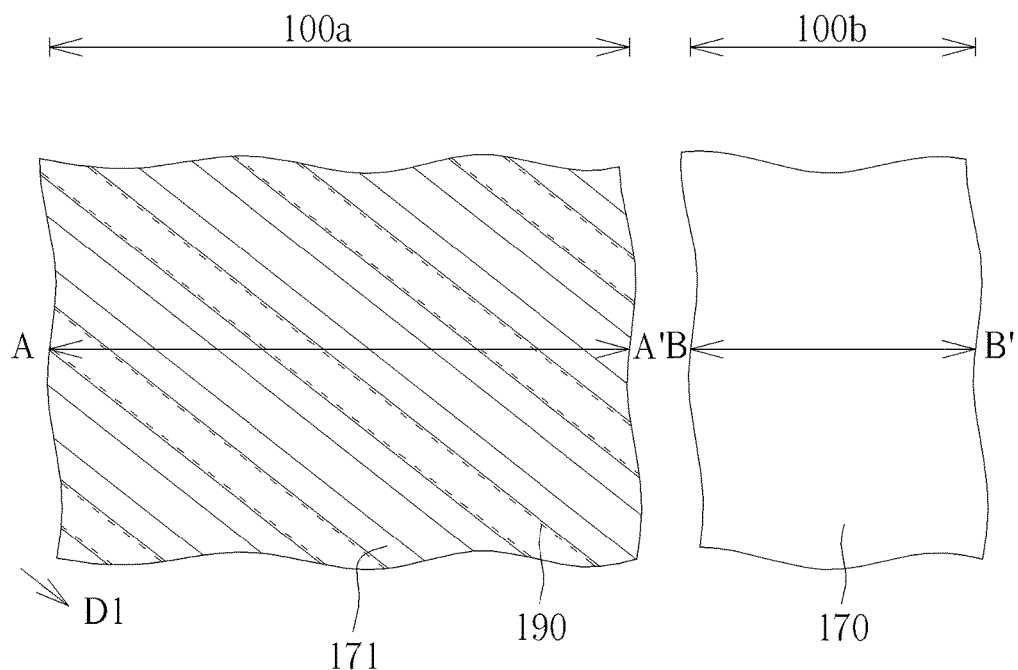

Next, another mask layer 170 is further formed on the mask layer 150, covered both of the first region 100a and the second region 100b. It is noted that, the mask layer 170 disposed within the first region 100a has been patterned via a patterning process, thereto form a plurality of mask patterns 171 parallel extended along a first direction D1, and the mask layer 171 disposed within the second region 100b entirely covers the mask layer 150 underneath, without going through any patterning process. The first direction D1 is preferably a direction different form the x-direction or the y-direction, so that, the mask patterns 171 are not extended along the x-direction or the y-direction, as shown in FIGS. 1 and 2. In one embodiment, the method of forming the mask patterns 171 is for example through a sidewall image transfer (SIT) technique, which includes performing a lithography and etching process to form a plurality of patterned sacrificial layers on the mask layer 170, at the positions as shown in dashed frames 190 in FIG. 1, and then performing a deposition and etching process to form a spacer (not shown in the drawings) on sidewall of each patterned sacrificial layer. Then, the patterned sacrificial layers are completely removed to leave the spacer remained on the mask layer 170, and the mask patterns 171 are therefore formed through the spacer.

Figure 3:
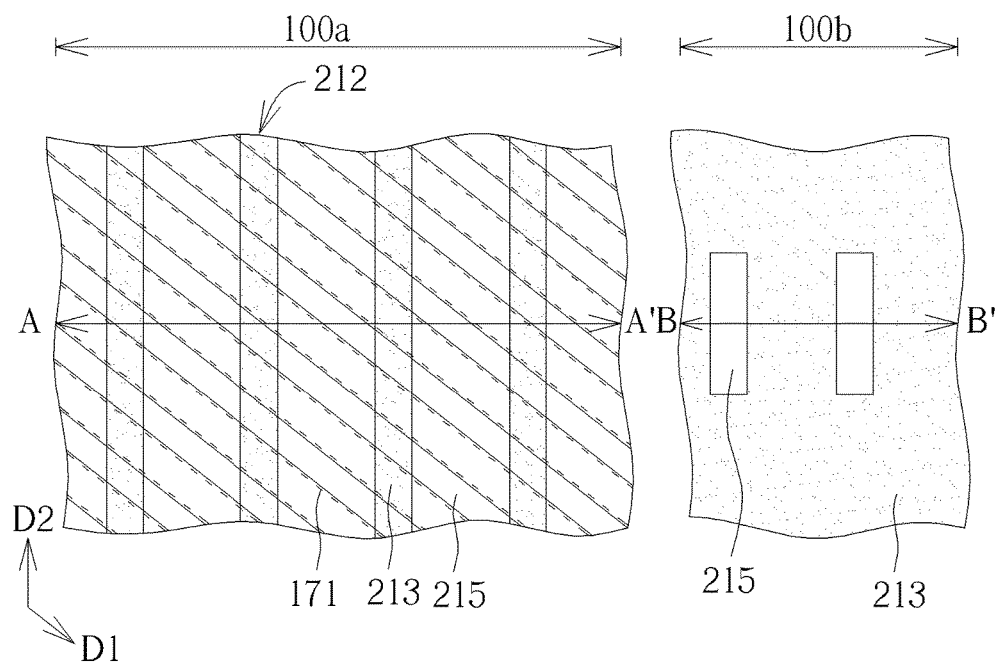
Figure 4:
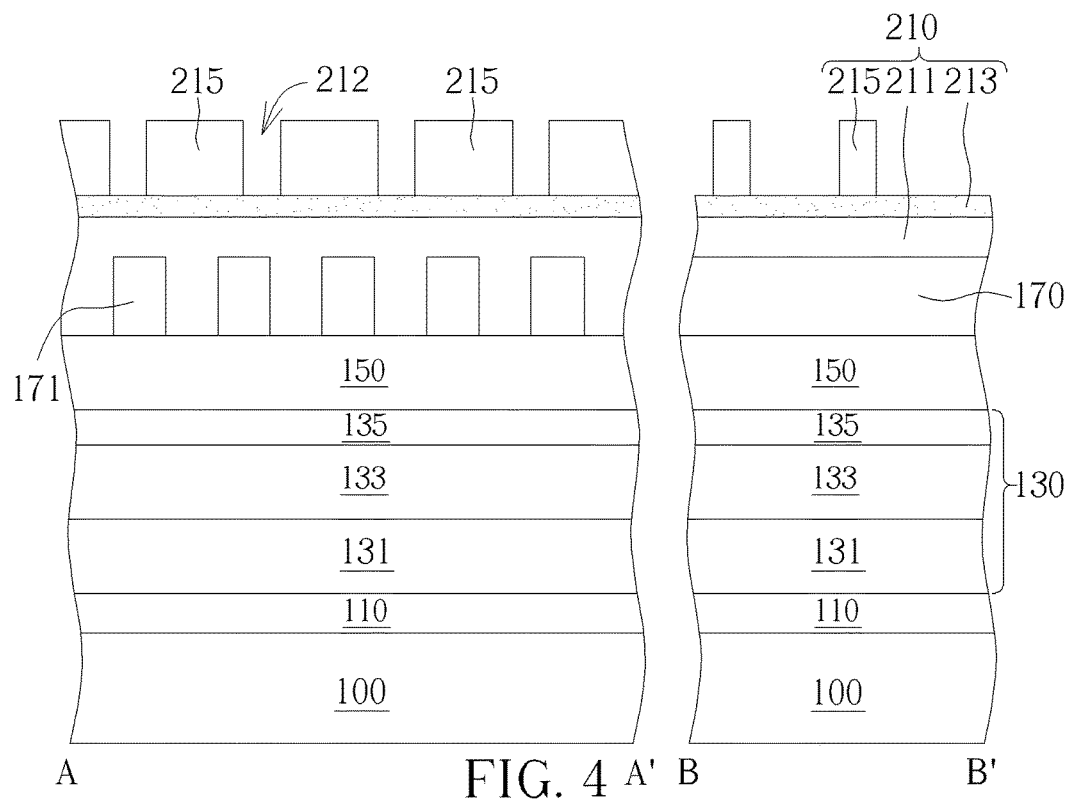

Next, a pattern splitting technique is performed, to form a plurality of openings 180 on the mask layer 170, across each of the mask patterns 171. For example, a photolithography-etch-photolithography-etch (2P2E) process is performing is performed in the present embodiment. In the first-staged photolithography-etch process, a composite photoresist 210 for example including a sacrificial layer 211, a mask layer 213 and a patterned photoresist layer 215 is formed on the mask layer 170, with the planar sacrificial layer 211 entirely covering the mask layer 170 and further filling in the gaps between each mask patterns 171 in the first regions 100a, followed by sequentially forming the mask layer 213 and the patterned photoresist layer 215 on the sacrificial layer 211, as shown in FIG. 4. It is noted that, in the first-staged photolithography-etch process, a plurality of primary openings 212 is defined on the first region 100a by using the patterned photoresist layer 215, and the mask layer 213 underneath is therefore exposed from the primary openings 212. On the other hand, while defining the primary openings 212, two primary entity-patterns are simultaneously formed on the second region 100b also through the patterned photoresist layer 215, with the two primary entity-patterns disposed separately on the mask layer 213 to expose most surfaces of the mask layer 213, as shown in FIGS. 3 and 4. Also, the two primary entity-patterns within the second region 100b and the primary openings 212 within the first regions 100a are both extended along a second direction D2 different from the first direction D1, and the second direction D2 is preferably the y-direction as shown in FIG. 3 or the x-direction (not shown in the drawings).

Figure 5:
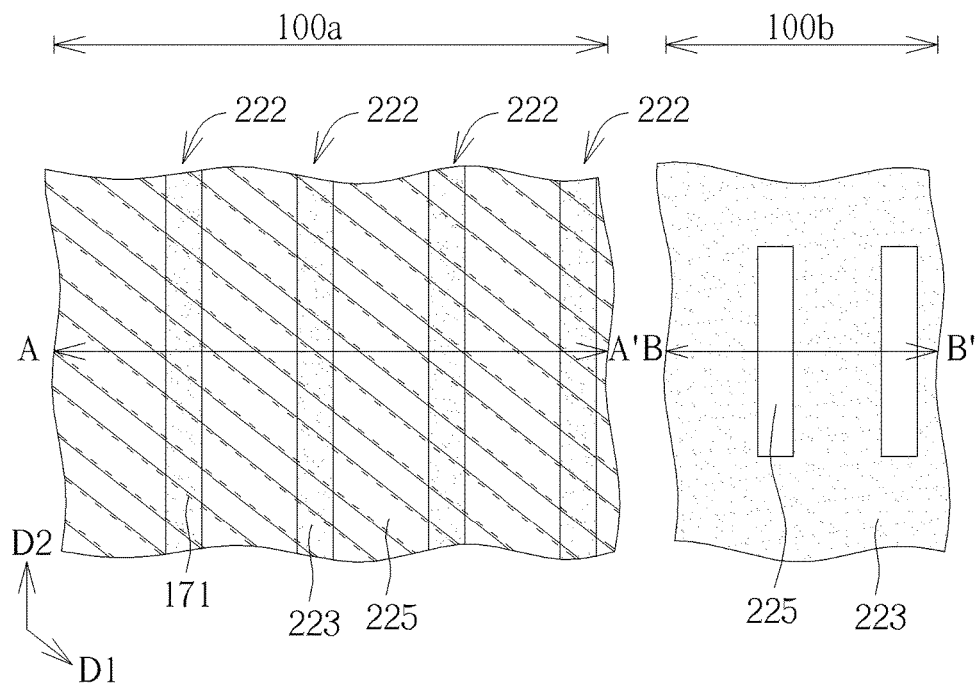
Figure 6:
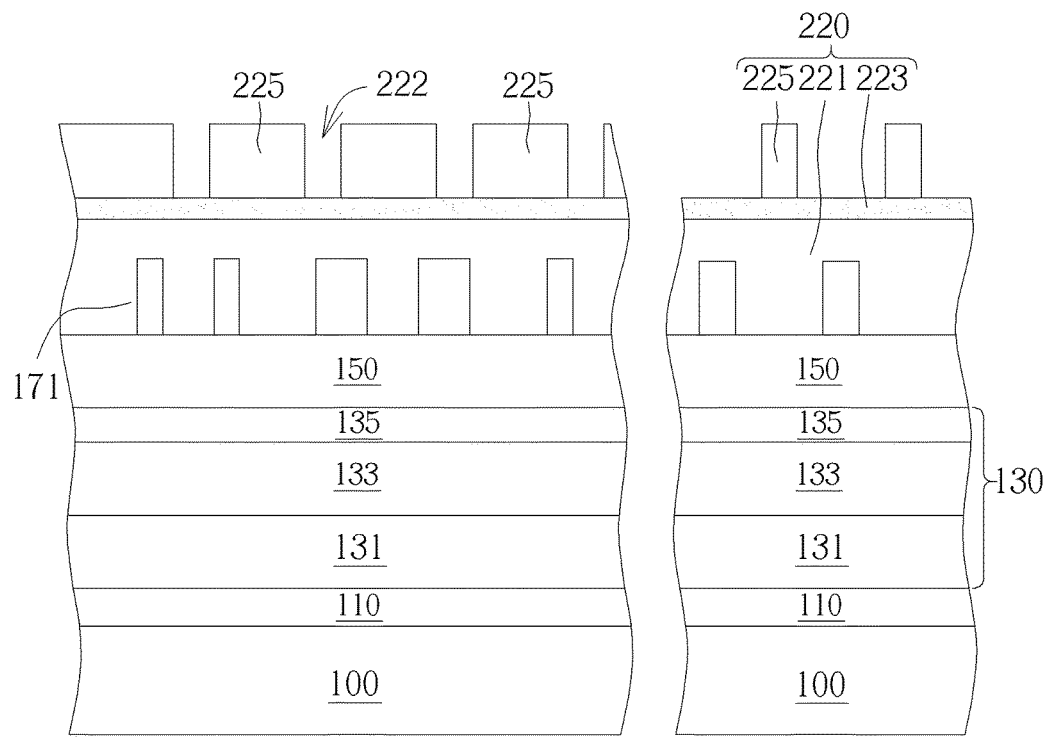

Then, the first-staged etching process is performed through the patterned photoresist layer 215, to sequentially remove the exposed mask layer 213, the sacrificial layer 211 and a portion of the mask patterns 171, as shown in FIGS. 5 and 6. The composite photoresist 210 is completely removed then. Following these, another composite photoresist 220 for example including a sacrificial layer 221, a mask layer 223 and a patterned photoresist layer 225 is formed on the mask layer 170. The planar sacrificial layer 221 entirely covers the mask layer 170 and further fills in the gaps between each mask patterns 171 in the first regions 100a, and the mask layer 223 and the patterned photoresist layer 225 are then sequentially formed on the sacrificial layer 221, as shown in FIG. 6. In the second-staged photolithography-etch process, a plurality of primary openings 222 parallel extended along the second direction D2 is defined on the first region 100a by using the patterned photoresist layer 225, and the mask layer 223 underneath is therefore exposed from the primary openings 222.

On the other hand, while defining the primary openings 222, another two primary entity-patterns extended along the second direction D2 are simultaneously formed on the second region 100b also through the patterned photoresist layer 225, with the two primary entity-patterns separately disposed on the mask layer 223 to expose most surfaces of the mask layer 223, as shown in FIGS. 5 and 6. It is noted that, the primary openings 212, 222 formed through the 2P2E process are alternately arranged within the first region 100a, with each of the primary openings 212, 222 spaced and not overlapped with each other. Likewise, the primary entity-patterns formed through the 2P2E process are also alternately arranged within the second region 100b, with each of the primary entity-patterns also spaced and not overlapped with each other as shown in FIG. 6.

Figure 7:
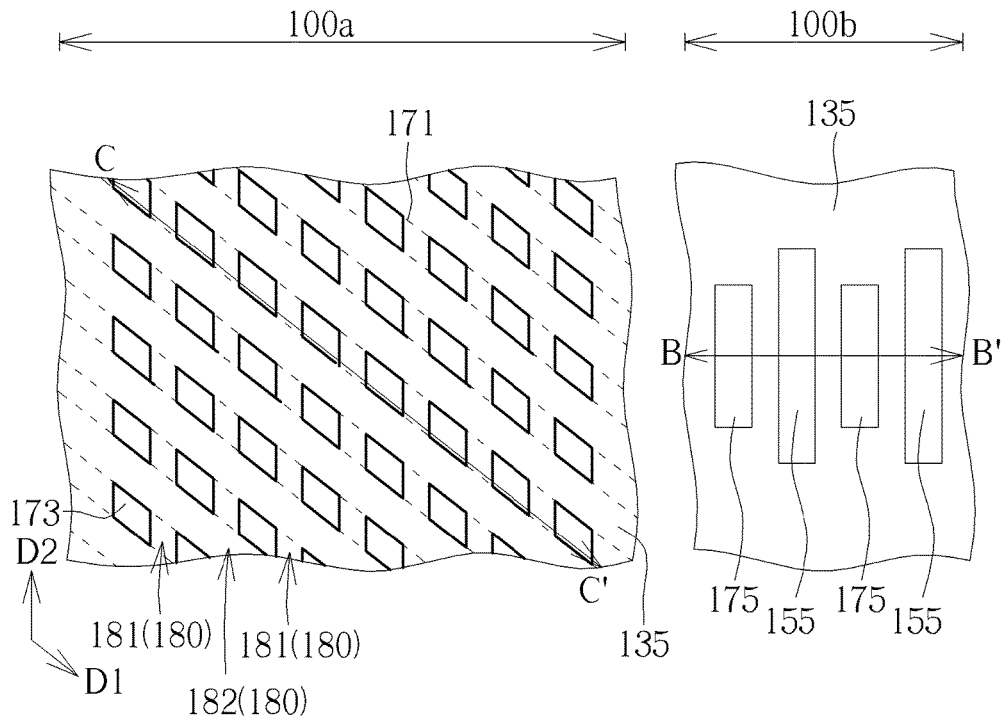
Figure 8:
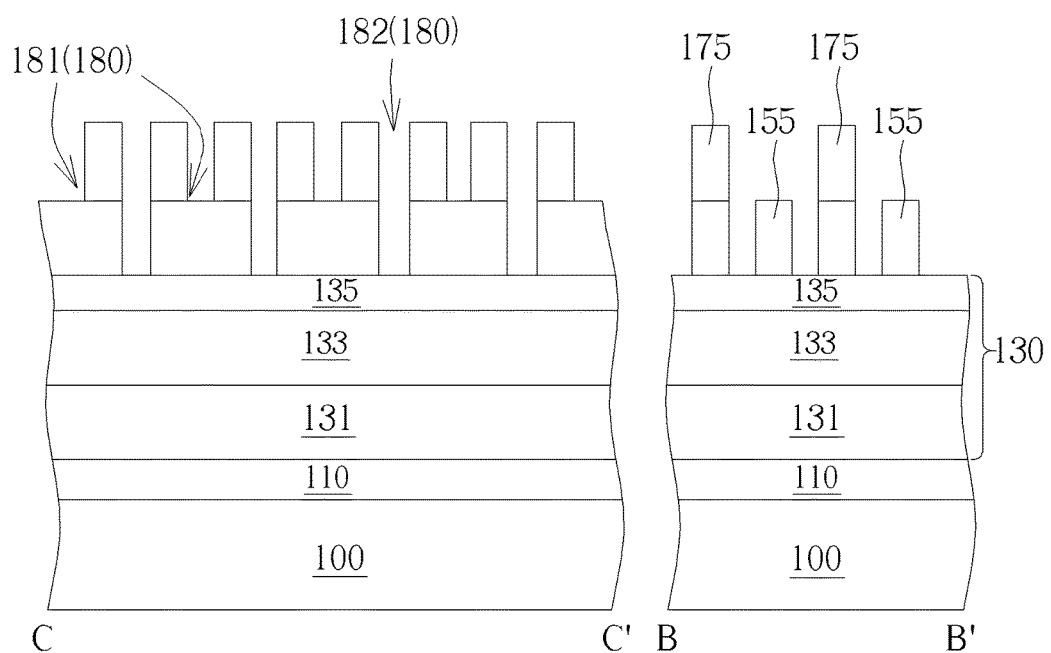

Moreover, the second-staged etching process is performed through the patterned photoresist layer 225, to sequentially remove the exposed mask layer 223, the sacrificial layer 221, a portion of the mask patterns 171 and the mask layer 150 underneath, as shown in FIGS. 7 and 8. Then, the composite photoresist 220 is completely removed. In the present etching process, the mask layer 150 under the mask patterns 171 is further removed while removing the mask patterns 171 exposed from the primary openings 222, so that, the openings 182 are formed both in the mask layers 150, 170 within the first region 100a.

The openings 181, 182 are formed on the mask layer 170 respectively through the aforementioned 2P2E process, with each openings 181, 182 parallel extended in the second direction D2 to cross each mask patterns 171, as shown in FIG. 7. In other words, each openings 181, 182 are formed by respectively removing different portions of each mask pattern 171. That is, each opening 181, 182 may therefore overlap with a portion of each mask pattern 171. Through these performances, each of the mask patterns 171 originally formed within the first region 100a are further patterned in the 2P2E process, thereto form a plurality of patterns 173. The patterns 173 are in an array arrangement, and each of the patterns 173 has the same regular shape such as a parallelogram-shape from a top view as shown in FIG. 7.

On the other hand, while forming the openings 181, 182 in the 2P2E process, a mask pattern 175 is simultaneously formed in the mask layers 170, 150, and a mask pattern 155 is simultaneously formed in the mask layer 150, within the second region 100b, as shown in FIGS. 7 and 8. Please note that, the mask layer 150 under the mask patterns 171 is further removed while removing the mask patterns 171 exposed from the composite photoresist 220, so that, the openings 182 are formed both in the mask layers 150, 170 to obtain a greater depth. Meanwhile, the mask pattern 155 is therefore formed in the mask layer 150 within the second regions 100b.

In the following, another etching process may be performed by using the patterns 173 within the first region 100a and the mask patters 155, 175 within the second region 100b as an etching mask, to pattern the hard mask layer 130 and/or the target layer 110 underneath. That is, a plurality of hard mask patterns (not shown in the drawings) and/or a plurality of target patterns (not shown in the drawings) may be formed in alignment with each pattern 173 and the mask patterns 175, 155. The hard mask patterns and the target patterns are in an array arrangement in the first region 100a, and each of the hard mask patterns and the target patterns may have the same regular shape like a parallelogram-shape.

According to the aforementioned processes, a method of forming a semiconductor device according to the first embodiment is accomplished. In the present method, a multiple patterning process is used to form the required tiny elements in the semiconductor device. For example, the SIT process is performed, to form the mask patterns 171 in the mask layer 170 within the first region 100a, and the pattern splitting technique is next performed to define the openings 181, 182 across each mask patterns 171 in the second direction D2 different from the extending direction D1 of the mask patterns 171. In this way, the mask patterns 171 are partially removed while performing the pattern splitting technique, and the non-removed mask patterns 171 remained on the hard mask layer 130 form patterns 173 in the array arrangement, with each pattern 173 having the same and regular shape (such as a parallelogram-shape). On the other hand, the mask patterns 175, 155 extended along the second direction D2 are simultaneously formed within the second region 100b, while performing the pattern splitting technique. That is, in the method of the present embodiment, the patterns 173 and the mask patterns 175, 155 may be used to pattern the films formed underneath such as the hard mask layer 130 and or the target layer 110, thereto to form corresponding patterns in those films.

Based on the aforementioned embodiment, it is noted that the present method is accomplished by various multiple patterning processes, for example the SIT technique and the pattern splitting technique, to respectively form mask patterns and openings which are across with each other. With such performance, the tiny hard mask patterns and/or target patterns in a more densely layout are allowable to be formed under a simplified process flow. Furthermore, while performing the pattern splitting technique of the present embodiment, the openings and the entity-patterns are simultaneously defined in two different regions, such that, a less number of photo masks is required to be used in this process flow. Thus, the method of the present invention may be practical applied on a semiconductor process, for example a process of a semiconductor memory device like a dynamic random access memory (DRAM) device, to form the contact pads electrically connected to each storage node contact (SNC).

Figure 9:
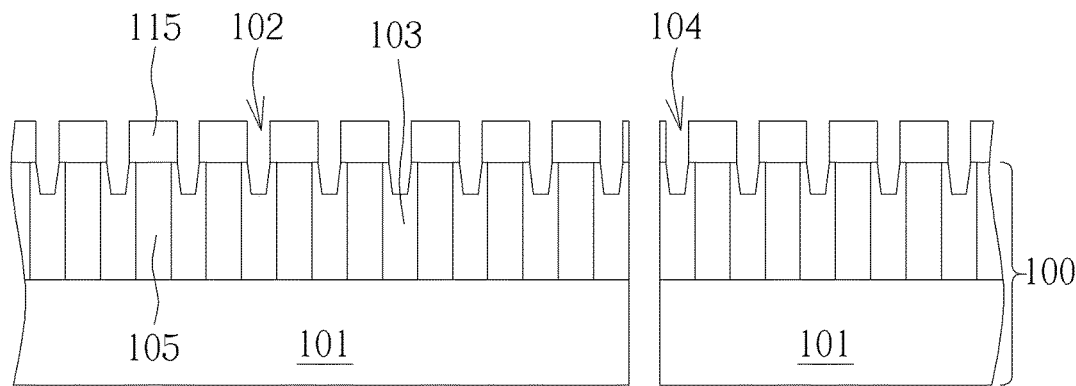
FIG. 9 is a schematic diagram illustrating a cross-sectional view of a semiconductor device according to a preferred embodiment of the present invention.

For example, in one embodiment, the substrate layer 100 may include a semiconductor substrate 101 such as a silicon substrate, and a dielectric layer 103 such as including silicon nitride, disposed on the semiconductor substrate 101. The first region 100a of the substrate layer 100 is configured as a cell region, and the second region 100b of the substrate layer 100 is configured as a periphery region. Also, a buried transistor (not shown in the drawings) may be formed in the semiconductor substrate 101 to function like a word line (WL), and a plurality of bit lines (BLs) and a plurality of plugs 105 may also be formed in the dielectric layer 103 on the semiconductor substrate 101, as shown in FIG. 9.

The target layer 110 of the present embodiment for example includes a conductive layer including a low-resistant metal material like tungsten (W), alumina (Al) or copper (Cu). With such arrangement, when performing the present method by sequentially patterning the hard mask layer 130, the target layer 110 (namely the conductive layer of the present embodiment) and a portion of the dielectric layer 103 through the patterns 173 and the mask patterns 175, 155, a plurality of openings 102, 104 are respectively formed within the first region 100a (the cell region) and the second region 100b (the periphery region) thereto form a plurality of conductive patterns 115 in the conductive layer, as shown in FIG. 9. In this way, each of the conductive patterns 115 may also obtain the same and regular shape like a parallelogram-shape, and the conductive patterns 115 are arranged in an array arrangement from a top view (not shown in the drawings) with each conductive pattern 115 in alignment with each plugs 105 underneath.

It is noted that, each conductive patterns 115 may directly connect the plugs 105 to function like a storage node pad (SN pad), so that, each plugs 105 may further electrically connect to a source/drain region (not shown in the drawings) of the transistor via a silicide layer (not shown in the drawings) to function like a SNC. However, the present method is not limited to be applied to the semiconductor memory process above, and in another embodiment, the method may also be applied to other semiconductor processes for forming tiny elements with a more densely layout in a simplified process.

People skilled in the arts may fully understand that the method of the present invention is not limited to be achieved through the aforementioned process, and also include other process. For example, in some embodiments, the hard mask layer 130 may be omitted, and the mask layers 150, 170 are directly formed on the target layer 110. The following description will detail the different embodiments of the method of the present invention. To simplify the description, the following description will detail the dissimilarities among the different embodiments and the identical features will not be redundantly described. In order to compare the differences between the embodiments easily, the identical components in each of the following embodiments are marked with identical symbols.

Figure 10:
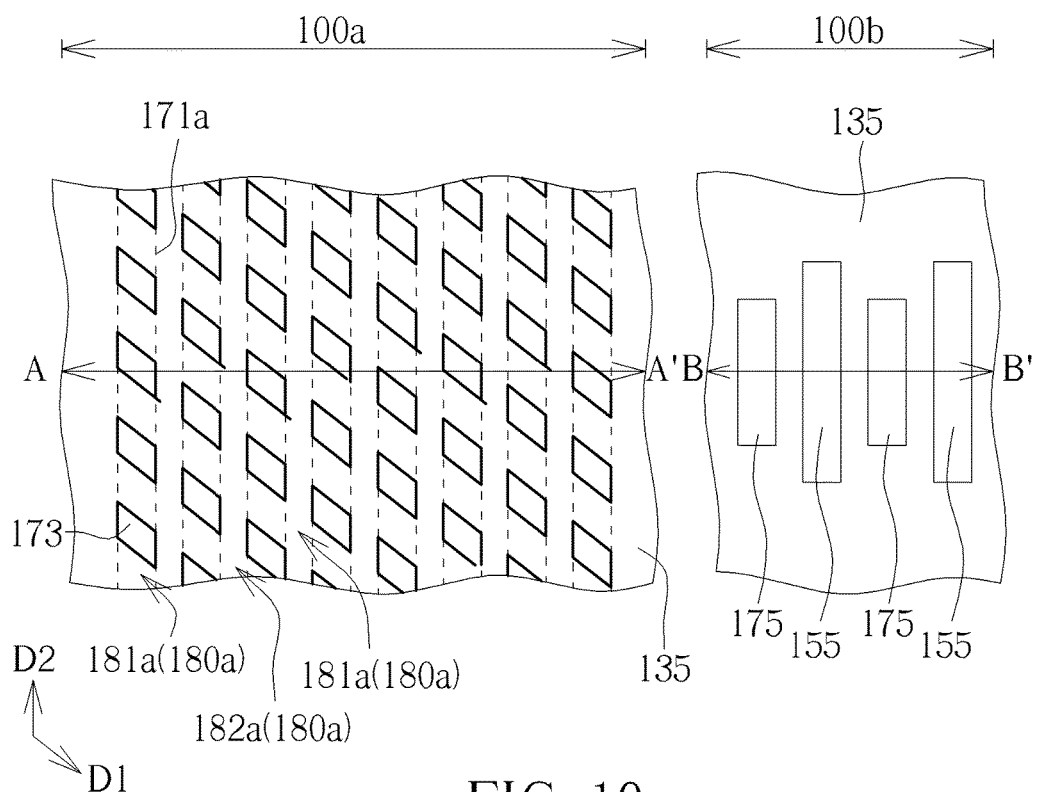
FIG. 10 is a schematic diagram illustrating a method of forming a semiconductor device according to a second embodiment of the present invention.

Referring to FIG. 10, which is a schematic diagram illustrating a forming process of a semiconductor device according to the second embodiment of the present invention. The formal steps in the present embodiment are similar to those in the first embodiment, and which will not redundantly described herein. The differences between the present embodiment and the aforementioned first embodiment are that, a plurality of mask patterns 171a extended along the second direction D2 is formed on the mask layer 170 within the first region 100a via the SIT technique, and a plurality of openings 180a extended along the first direction D1 within the first region 100a, as well as the mask patterns 175, 155 extended along the first direction D1 within the second region 100b are then formed by using the pattern splitting technique.

Precisely speaking, the openings 181a, 182a are respectively formed through the 2P2E process, with the openings 181a, 182a parallel and alternately extended in the first direction D1, across each mask patterns 171a and not perpendicular thereto, as shown in FIG. 10. It is noted that the openings 181a, 182a are namely formed by removing a portion of each mask pattern 171a, so that, the mask patterns 171a originally formed within the first region 100a are further patterned in the 2P2E process, thereto form the patterns 173. The patterns 173 are in an array arrangement, and each of the patterns 173 has the same regular shape such as a parallelogram-shape from a top view as shown in FIG. 10.

In the following, another etching process may be performed by using the patterns 173 within the first region 100a and the mask patters 155, 175 within the second region 100b as an etching mask, to pattern the hard mask layer 130 and/or the target layer 110 underneath. Accordingly, a plurality of hard mask patterns (not shown in the drawings) and/or a plurality of target patterns (not shown in the drawings) are formed in alignment with each pattern 173 and each mask pattern 175, 155, with the hard mask patterns and the target patterns within the first region 100a also in an array arrangement, and with each of the hard mask patterns and the target patterns having the same regular shape like a parallelogram-shape.

According to the aforementioned processes, a method of forming a semiconductor device according to the second embodiment is accomplished. In the present method, the SIT technique and the pattern splitting technique are optionally used to respectively form the mask patterns and the openings which are extended in different directions to cross with each other. That is, the present method may also obtain tiny hard mask patterns and/or target patterns in a more densely layout under a simplified process flow using a reduced number of photo masks.

Figure 11:
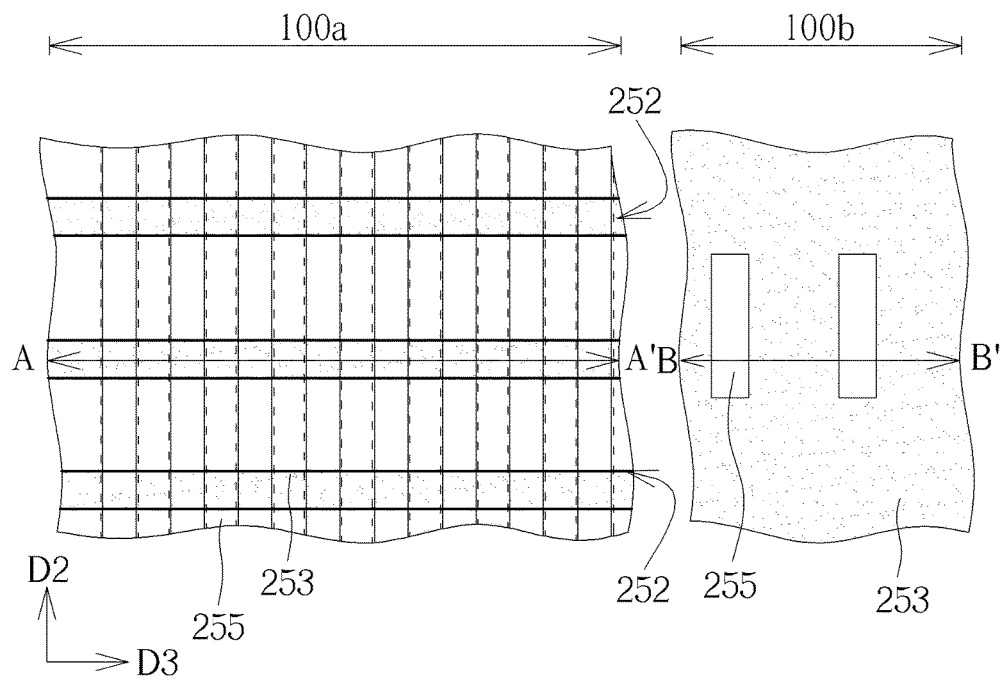
Figure 12:
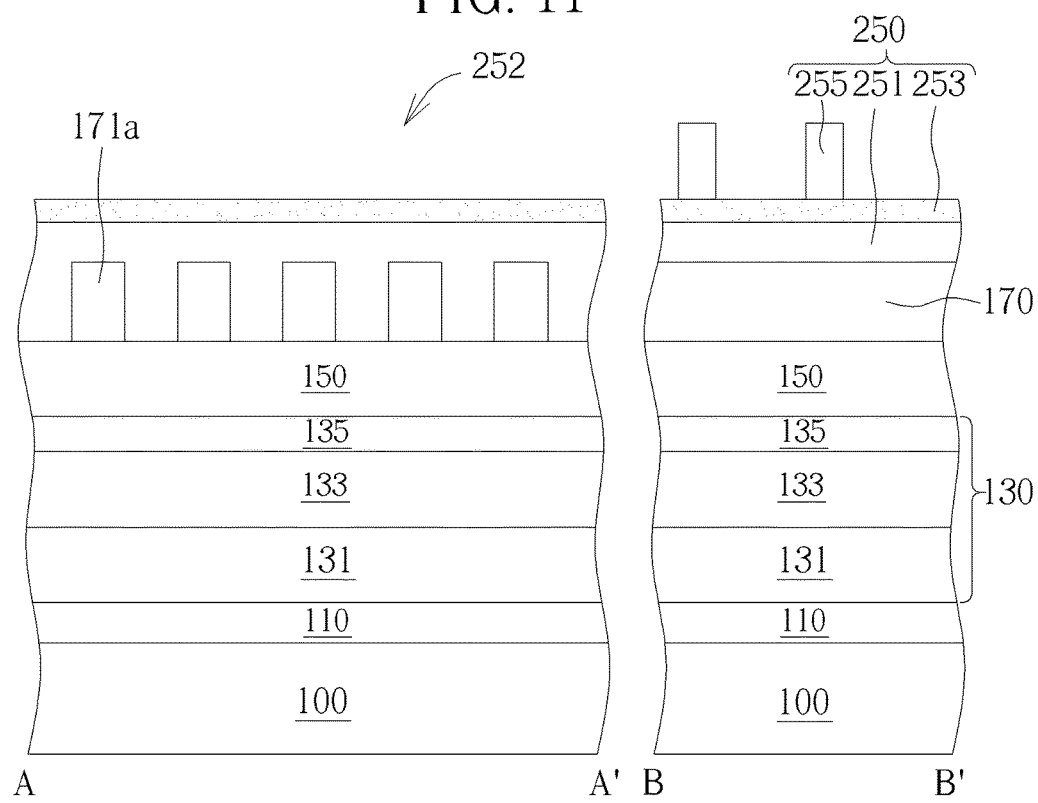
Figure 13:
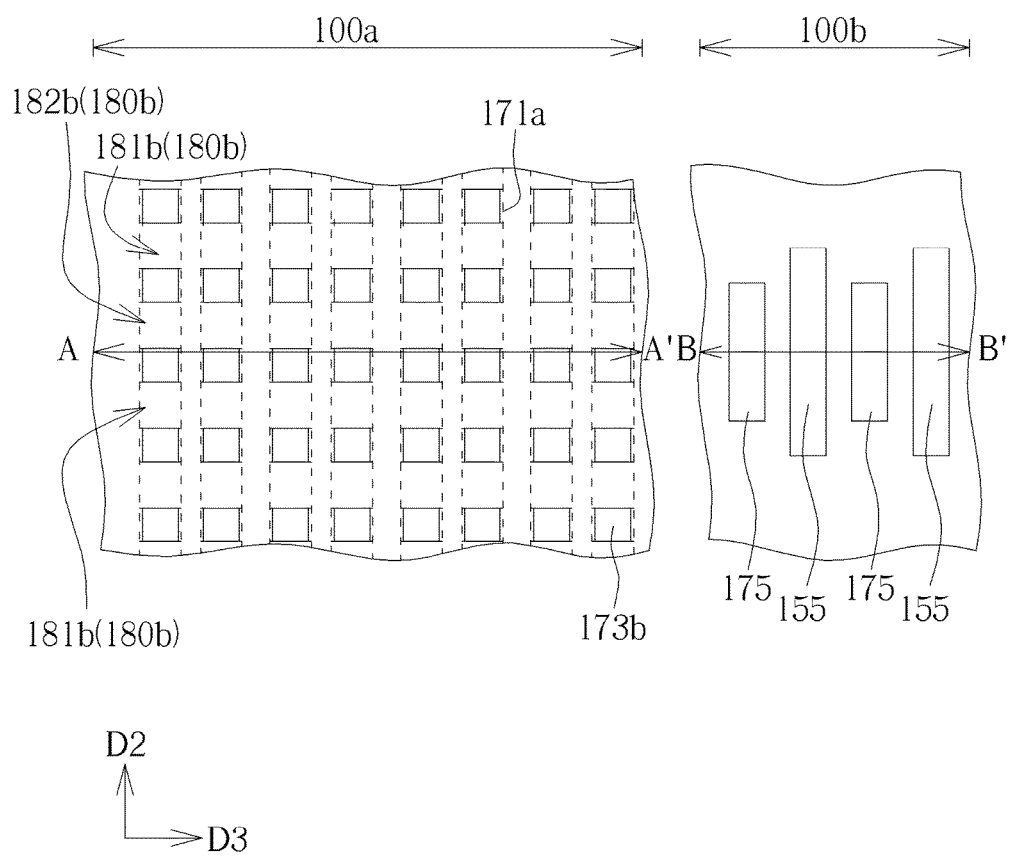

Referring to FIGS. 11-13, which are schematic diagrams illustrating a forming process of a semiconductor device according to the third embodiment of the present invention. The formal steps in the present embodiment are similar to those in the second embodiment, and which will not redundantly described herein. The differences between the present embodiment and the aforementioned second embodiment are that, after forming the mask patterns 171a within the first region 100a, the pattern splitting process is performed to form a plurality of openings 180b extended along a third direction D3 within the first region 100a, and the mask patterns 175, 155 extended along the third direction D3 within the second regions 100b. The third direction D3 is preferably perpendicular to the second direction D2, and the third direction D3 and the second direction D2 are preferably the x-direction and the y-direction respectively, as shown in FIG. 11. That is, the mask patterns 171a and the openings 180b are perpendicular to each other.

Precisely speaking, a composite photoresist 250 including a sacrificial layer 251, a mask layer 253 and a patterned photoresist layer 255 is formed on the mask layer 170, with the planar sacrificial layer 251 entirely covering the mask layer 170 and further filling in the gaps between each mask patterns 171a, and the mask layer 253 and the patterned photoresist layer 255 are sequentially formed on the sacrificial layer 251, as shown in FIG. 12. It is noted that, in the first-staged photolithography-etch process, a plurality of primary openings 252 is defined in the first region 100a by using the patterned photoresist layer 255, and the mask layer 253 underneath is therefore exposed from the primary openings 252. On the other hand, while defining the primary openings 252, two primary entity-patterns are simultaneously formed in the second region 100b also through the patterned photoresist layer 255, with the two primary entity-patterns separately being defined on the mask layer 253 to expose most surfaces of the mask layer 253, as shown in FIGS. 11 and 12.

Then, according to the processes shown in FIGS. 5-6 in the aforementioned embodiment, the first-staged etching process is performed through the patterned photoresist layer 255, to sequentially remove the exposed mask layer 253, the sacrificial layer 251 and a portion of the mask patterns 171a, thereto form the opening 181b across the mask patterns 171a with in the first region 100a. Following these, the second-staged photolithography-etch process is performed in a similar process above, by forming another composite photoresist (not shown in the drawings) and using a patterned photoresist layer (not shown in the drawings) of the composite photoresist to sequentially etch a sacrificial layer (not shown in the drawings), a mask layer (not shown in the drawings), and to etch the mask patterns 171a and the mask layer 150 underneath, thereto form the openings 182b as shown in FIG. 13.

In the present embodiment the mask patterns 171a and the openings 181b, 182s which are respectively formed through the two-staged photolithography-etch process are perpendicular to each other. Since each opening 181, 182 are formed by respectively removing different portions of each mask patterns 171a, each of the mask patterns 171a originally formed within the first region 100a are further patterned in the two-staged photolithography-etching process, to form a plurality of patterns 173b. The patterns 173b are in an array arrangement, and each of the patterns 173b has the same regular shape such as square-shape or rectangular-shape from a top view as shown in FIG. 13.

In the following, another etching process may be performed by using the patterns 173b within the first region 100a and the mask patters 155, 175 within the second region 100b as an etching mask, to pattern the hard mask layer 130 and/or the target layer 110 underneath. Accordingly, a plurality of hard mask patterns (not shown in the drawings) and/or a plurality of target patterns (not shown in the drawings) are formed in alignment with each pattern 173b and the mask pattern 175, 155, with the hard mask patterns and the target patterns within the first region 100a also in an array arrangement, and with each of the hard mask patterns and the target patterns having the same regular shape like a square-shape or a rectangular-shape.

According to the aforementioned processes, a method of forming a semiconductor device according to the third embodiment is accomplished. In the present method, the SIT technique and the pattern splitting technique are optionally used to form the mask patterns and the openings which are extended in different direction. Also, the mask patterns and the openings may be either across or perpendicular to each other, so as to form tiny hard mask patterns and/or target patterns in a more densely layout under a simplified process flow using a reduced number of photo masks.

In overall speaking, the method of the present invention utilizes a multiple patterning process, such as the SIT process and the pattern splitting process, to form the mask patterns and the openings respectively in a material layer, such as the hard mask layer and/or the target layer. The mask patterns and the openings are extended along different directions, with those mask patterns and the openings either across with each other or perpendicular to each other. That is, the original mask patterns may be partially removed while the openings are formed, so that, the rest portions of the mask patterns may form a plurality of patterns in the same and regular shape like a parallelogram-shape, a rectangular-shape or a square-shape. Those patterns are in an array arrangement from a top view. In this way, the patterns may further be used on patterning the aforementioned material layers, thereto form tiny hard mask patterns and/or target patterns in a more densely layout. Thus, the method of the present invention is allowable to form required tiny elements of a semiconductor device under a simplified process flow using a reduced number of photo masks.

In additional, people skilled in the arts may fully understand that although the multiple patterning processes of the aforementioned embodiments are all exemplified by using a 2P2E process, and the present invention is not limited to be achieved thereto. In some embodiments, a photolithography-photolithography-etching (2P1E) process may also be used to form the openings. For example, a mask structure (not shown in the drawings) and a first photoresist (not shown in the drawings) may be further formed on the mask patterns 171 and the mask layer 170 as shown in FIGS. 1-2, with the first photoresist defining the first primary opening 212 within the first region 100*a* and the primary entity-patterns within the second regions 100*b* in the mask structure, a second photoresist layer (not shown in the drawings) is then formed on the mask structure, with the second photoresist further defining the second primary opening 222 within the first region 100*a* and the another primary entity-patterns within the second regions 100*b* in the mask structure, and the etching process is finally perform by using the mask structure, to simultaneously pattern the mask patterns 171 and the mask layer 170, 150 to form the patterns 173 and the mask patterns 175, 155. Otherwise, a plurality of primary entity-patterns (not shown in the drawings) may also be defined in the mask structure by using the first photoresist, followed by removing the first photoresist. Then, another mask structure (not shown in the drawings) and a second photoresist are further formed on the mask structure, with the second photoresist further defining a plurality primary entity-patterns within the first regions 100*a* and second regions 100*b* in the another mask structure, and with the primary entity-patterns form by two photoresist being alternately arranged. Finally, an etching process is performed by simultaneously using the two mask structure as an etch mask, to pattern the mask layers 170, 150 to form the patterns 173 and the mask patterns 155, 175 in corresponding positions.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of forming a semiconductor device, comprising:
   providing a material layer on a substrate;
   performing a spacer patterning process to form a plurality of first mask patterns parallel with each other on the material layer, the first mask patterns extending along a first direction;
   performing a pattern splitting process to remove a portion of the first mask patterns to form a plurality of second openings, the second openings parallel with each other and extending along a second direction, across the first mask patterns; and
   patterning the material layer by using remaining portion of the first mask patterns as a mask, to form a plurality of patterns in an array arrangement.

2. The method of forming a semiconductor device according to claim 1, wherein the pattern splitting process comprises:
   forming a sacrificial layer and a mask layer covering on the first mask patterns, the sacrificial layer is filled between each first mask patterns;
   partially removing the mask layer to form a plurality of first primary openings extended along the second direction in the mask layer;
   patterning the sacrificial layer and the first mask patterns to form a portion of the second openings;
   forming another sacrificial layer and another mask layer covering on the first mask patterns, the another sacrificial layer is filled between each first mask patterns;
   partially removing the another mask layer to form a plurality of second primary openings extended along the second direction in the another mask layer; and
   patterning the another sacrificial layer and the first mask patterns to form another portion of the second openings.

3. The method of forming a semiconductor device according to claim 1, further comprising:
   forming a mask structure covering on the first mask patterns;
   partially removing the mask structure to form a plurality of first primary openings extended along the second direction in the mask structure;
   further removing the mask structure to form a plurality of second primary openings extended along the second direction in the mask structure; and
   patterning the first mask patterns to form the second openings.

4. The method of forming a semiconductor device according to claim 1, wherein the second direction is perpendicular to the first direction.

5. The method of forming a semiconductor memory device according to claim 1, wherein the second direction is not perpendicular to the first direction.

6. The method of forming a semiconductor device according to claim 1, wherein each of the patterns comprises a parallelogram-shape.

7. The method of forming a semiconductor device according to claim 1, wherein each of the patterns comprises a rectangular-shape or a square-shape.

8. The method of forming a semiconductor device according to claim 1, wherein the material layer comprises a conductive layer.

9. The method of forming a semiconductor device according to claim 8, further comprising:
   forming a dielectric layer on the substrate;
   forming a plurality of plugs in the dielectric layer; and forming the conductive layer on the plugs and the dielectric layer, wherein the patterns are in alignment with the plugs to directly contact to the plug.

10. The method of forming a semiconductor device according to claim 1, wherein the material layer comprises a hard mask layer.

11. The method of forming a semiconductor device according to claim 10, further comprising:
   forming a dielectric layer on the substrate;
   forming a plurality of plugs in the dielectric layer;
   forming a conductive layer on the plugs and the dielectric layer, wherein the hard mask layer is formed on the conductive layer; and
   patterning the conductive layer by using the patterns as a mask, to form a plurality of conductive patterns.

12. The method of forming a semiconductor device according to claim 10, wherein the conductive patterns are in alignment with the plugs to directly contact to the plug.

13. The method of forming a semiconductor device according to claim 2, wherein the substrate has a cell region and a periphery region, and first mask patterns and the second openings are formed within the cell region.

14. The method of forming a semiconductor device according to claim 13, wherein the material layer is formed on the cell region and the periphery region, and the method further comprises:
   forming a plurality of third mask patterns on the material layer, within the periphery region.

15. The method of forming a semiconductor device according to claim 14, wherein the third mask patterns are formed while performing the pattern splitting process.

16. The method of forming a semiconductor device according to claim 14, wherein the forming of the third mask patterns comprises:
   forming the sacrificial layer and the mask layer covering the cell region and the periphery region of the substrate;
   forming a third primary patterns extended along the second direction on the mask layer, within the periphery region;
   patterning the sacrificial layer to form a portion of the third mask patterns;
   forming the another sacrificial layer and the another mask layer covering the cell region and the periphery region of the substrate;
   forming a fourth primary patterns extended along the second direction on the another mask layer, within the periphery region; and
   patterning the another sacrificial layer to form another portion of the third mask patterns.

* * * * *